(12) United States Patent
Sun et al.

(10) Patent No.: US 10,181,398 B2
(45) Date of Patent: Jan. 15, 2019

(54) STRAIN-CONTROL HETEROSTRUCTURE GROWTH

(71) Applicant: Sensor Electronic Technology, Inc., Columbia, SC (US)

(72) Inventors: Wenhong Sun, Columbia, SC (US); Alexander Dobrinsky, Loudonville, NY (US); Maxim S. Shatalov, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 241 days.

(21) Appl. No.: 14/983,624

(22) Filed: Dec. 30, 2015

(65) Prior Publication Data
US 2016/0190387 A1     Jun. 30, 2016

Related U.S. Application Data

(60) Provisional application No. 62/098,093, filed on Dec. 30, 2014.

(51) Int. Cl.
| | |
|---|---|
| *H01L 21/02* | (2006.01) |
| *H01L 33/00* | (2010.01) |
| *H01L 33/12* | (2010.01) |

(52) U.S. Cl.
CPC .... *H01L 21/02458* (2013.01); *H01L 21/0254* (2013.01); *H01L 21/0262* (2013.01); *H01L 21/02505* (2013.01); *H01L 33/007* (2013.01); *H01L 33/12* (2013.01)

(58) Field of Classification Search
CPC combination set(s) only.
See application file for complete search history.

(56) References Cited

U.S. PATENT DOCUMENTS

| | | | |
|---|---|---|---|
| 2007/0072396 A1 | 3/2007 | Feltin et al. | |
| 2008/0283854 A1 | 11/2008 | Iza et al. | |
| 2009/0176352 A1* | 7/2009 | Yokoyama | H01L 29/7787 438/479 |

(Continued)

OTHER PUBLICATIONS

Green, D.S. et al., "Control of epitaxial defects for optimal AlGaN/GaN HEMT performance and reliability," Journal of Crystal Growth, vol. 272, No. 1-4, pp. 285-292, Dec. 2004.

(Continued)

*Primary Examiner* — Ratisha Mehta
(74) *Attorney, Agent, or Firm* — LaBatt, LLC

(57) ABSTRACT

A solution for fabricating a group III nitride heterostructure and/or a corresponding device is provided. The heterostructure can include a nucleation layer, which can be grown on a lattice mismatched substrate using a set of nucleation layer growth parameters. An aluminum nitride layer can be grown on the nucleation layer using a set of aluminum nitride layer growth parameters. The respective growth parameters can be configured to result in a target type and level of strain in the aluminum nitride layer that is conducive for growth of additional heterostructure layers resulting in strains and strain energies not exceeding threshold values which can cause relaxation and/or dislocation formation.

20 Claims, 11 Drawing Sheets

(56) References Cited

U.S. PATENT DOCUMENTS

| | | |
|---|---|---|
| 2013/0270519 A1* | 10/2013 | Sun .................. H01L 33/06 257/13 |
| 2014/0110754 A1 | 4/2014 | Jain et al. |
| 2014/0134775 A1 | 5/2014 | Yang et al. |
| 2014/0326950 A1 | 11/2014 | Shatalov et al. |
| 2015/0108428 A1 | 4/2015 | Shatalov et al. |
| 2015/0295127 A1 | 10/2015 | Shur et al. |
| 2015/0295133 A1 | 10/2015 | Billingsley et al. |

OTHER PUBLICATIONS

Jain, R. et al., "Migration enhanced lateral epitaxial overgrowth of AlN and AlGaN for high reliability deep ultraviolet light emitting diodes," Applied Physics Letters, 2008, 4 pages, vol. 93, No. 5.

Sakai, Y. et al., "Demonstration of AlGaN-Based Deep-Ultraviolet Light-Emitting Diodes on High-Quality AlN Templates," Japanese Journal of Applied Physics, Feb. 2010, 4 pages, vol. 49, No. 2.

Park, H., International Application No. PCT/US2015/067984, Search Report and Written Opinion, dated Apr. 25, 2016, 10 pages.

Green, D.S. et al., "Control of epitaxial defects for optimal AlGaN/GaN HEMT performance and reliability," Journal of Crystal Growth, Dec. 2004, Abstract.

Sakai, Y. et al., "Demonstration of AlGaN-Based Deep-Ultraviolet Light-Emitting Diodes on High-Quality AlN Templates," Japanese Journal of Applied Physics, Feb. 2010, Abstract.

Wu, X.H. et al., "Dislocation generation in GaN heteroepitaxy," Journal of Crystral Growth, vol. 189-190, 1998, Abstract.

* cited by examiner

STRAIN-CONTROL HETEROSTRUCTURE GROWTH

REFERENCE TO RELATED APPLICATIONS

The current application claims the benefit of U.S. Provisional Application No. 62/098,093, which was filed on 30 Dec. 2014, and which is hereby incorporated by reference.

TECHNICAL FIELD

The disclosure relates generally to fabrication of semiconductor heterostructures, and more particularly, to fabrication of a semiconductor heterostructure having an improved reliability.

BACKGROUND ART

With an increasing complexity of light emitting diodes (LEDs), and in particular, ultraviolet light emitting diodes (UV LEDs) based on group III nitride semiconductor layers, aspects of reliability and lifetime, and thus the costs associated with light emitting diodes, become increasingly important. Reliability and lifetime can be a basic decision factor for selection of a source for UV LEDs. Reliability is a significant concern that presents a challenge during optimization of epi structures and device package designs (such as heat management). The lifetime and reliability of UV LEDs are dependent on many factors, such as design flaws of a UV LED system component, manufacturing defects, wear-out mechanisms, and/or the structure of epi designs for the UV LEDs. The failure of any LED system component—not just including the array of LED packages, but also the electronics, thermal management, optics, wires, connectors, seals, or other weatherproofing, for example—can directly or indirectly lead to product failure. Further, while some LED products will fail in a familiar catastrophic way, others may exhibit parametric failure, in which the LED product stops producing an acceptable quantity or quality of light.

Fabrication of a high-quality aluminum gallium nitride (AlGaN) epitaxy continues to be challenged by a lack of matched substrates. Threading dislocations that result from heteroepitaxy are responsible for leakage currents, trapping effects, and may adversely affect device reliability. AlN nucleation conditions can be important for reliability of the device when grown on silicon carbide (SiC) substrates. For example, variation of the nucleation temperature, V/III ratio, and thickness can have a dramatic effect on the balance between edge, screw and mixed character dislocation densities. Electrical and structural properties have been assessed by AFM and XRD on a material level and through DC and RF performance at the device level. The ratio between dislocation characteristics has been established primarily through comparison of symmetric and asymmetric XRD rocking curve widths.

One prior art study evaluated microstructural evolution, with particular emphasis on threading dislocation generation, in a two-step metal-organic chemical vapor deposition (MOCVD) of GaN on sapphire. MOCVD growths were carried out at atmospheric pressure in a horizontal two-flow reactor. Nominally, 200 Angstrom (Å) thick nucleation layers were deposited at temperatures in a range of 525-600° C. followed by high temperature growth at temperatures in a range of 1060-1080° C. Throughout the different stages of growth, the microstructure was studied by transmission electron microscopy (TEM) and atomic force microscopy (AFM). Two growth conditions were closely studied: brief pre-growth ammonia exposure of the sapphire ('Material A') and extensive pre-growth ammonia exposure of the sapphire ('Material B').

The study concluded that nucleation layer growth conditions and the resulting microstructure, after high temperature exposure, critically impact the GaN microstructure. The work showed that if the nucleation layer after high temperature exposure has threading dislocations, then these threading dislocations will propagate into the high temperature GaN and it is likely that the resulting GaN will have a high threading dislocation density (e.g., $10^{10}$-$10^{11}$ cm$^{-2}$). Material A results demonstrate that the optimal nucleation layers to achieve low threading dislocation densities (e.g., $10^8$-$10^9$ cm$^{-2}$) have rough morphologies and a high-degree-of-stacking disorder after high temperature exposure. Nucleation layers with these characteristics then provide a template for aligned growth of nearly perfect high temperature GaN islands. The high temperature islands appear to grow by a spiral mechanism. The majority of threading dislocations are subsequently generated at the coalescence of the high temperature islands.

While this work is relevant to the growth of AlGaN-based ultraviolet light emitting diodes, the growth conditions for AlGaN devices are significantly different from the growth conditions of devices rich in gallium.

A significant obstacle to improving the performance of DUV LEDs is the high threading dislocation density present in the LED structures due to heteroepitaxial growth on foreign substrates. Moreover, AlN and AlGaN films grown on such substrates beyond critical thicknesses suffer from cracking due to a strong tensile strain. While native AlN substrates alleviate this issue, presently commercially available AlN substrates are cost prohibitive, have usable area limitations, and suffer from excessive absorption. Meanwhile, alternate approaches, such as epitaxial lateral overgrowth (ELOG) of AlN and AlGaN, are being used to deposit thick films and limit the threading dislocation density in epilayers. The ELOG technique has been successfully employed to deposit several hundred micrometers thick crack-free GaN films, which demonstrate a 2-3 orders of magnitude reduction in the threading dislocation density. However, the lateral overgrowth often causes problems related to the coalescence of growth fronts, such as dislocation generation at the coalescence points due to wing tilts and stress relaxation. Devices produced on films with coalescence-related defects exhibit poor yield, making the approach impractical for commercial application.

Therefore, the coalescence of the growth fronts must be carefully controlled to prevent defect generation in large area films sufficient for device fabrication. To improve the quality of the semiconductor layers grown on sapphire substrates, a previous approach proposed growth of low-defect thick films of AlN and AlGaN on trenched AlGaN/sapphire templates using migration enhanced lateral epitaxial overgrowth. Incoherent coalescence-related defects were alleviated by controlling the tilt angle of growth fronts and by allowing aluminum adatoms sufficient residence time to incorporate at the most energetically favorable lattice sites. Deep ultraviolet light emitting diode structures (310 nm) deposited over fully coalesced thick AlN films exhibited a cw output power of 1.6 mW at 50 mA current with extrapolated lifetime in excess of 5000 hours. The results demonstrate substantial improvement in the device lifetime, primarily due to the reduced density of growth defects.

A study evaluated characteristics of AlGaN-based deep ultraviolet light emitting diodes (DUV LEDs) grown on a high-quality AlN/sapphire template (AlN template). LED structures were grown directly on a two inch diameter AlN template by metal-organic chemical vapor deposition. AlGaN epilayers were confirmed to have a high crystal quality on the AlN template through X-ray diffraction (XRD) and cross-sectional transmission electron microscopy (TEM). The fabricated LEDs exhibit a sharp single peak emission at a DUV region around 260-270 nm from electroluminescence spectra measured at room temperature. The light intensity and current-voltage characteristics are improved by using higher quality AlN template as the underlying substrate. This approach could facilitate the production of high-performance DUV LEDs.

SUMMARY OF THE INVENTION

While the previously described substrate patterning, and AlN substrates are common approaches for achieving higher quality epitaxial layers, these approaches are currently too expensive for production of UV LEDs in large quantities. To this extent, the inventors propose a solution for improving epitaxial growth of group III nitride semiconductor layers grown over a lattice mismatched substrate, such as a sapphire substrate. In an embodiment of the solution, properties of the semiconductor layers can be improved through consideration and optimization of their mechanical and/or electrical characteristics.

Aspects of the invention provide a solution for fabricating a group III nitride heterostructure and/or a corresponding device. The heterostructure can include a nucleation layer, which can be grown on a lattice mismatched substrate using a set of nucleation layer growth parameters. An aluminum nitride layer can be grown on the nucleation layer using a set of aluminum nitride layer growth parameters. The respective growth parameters can be configured to result in a target type and level of strain in the aluminum nitride layer that is conducive for growth of additional heterostructure layers resulting in strains and strain energies not exceeding threshold values which can cause relaxation and/or dislocation formation.

A first aspect of the invention provides a method of fabricating a group III nitride heterostructure, the method comprising: growing an aluminum nitride nucleation layer directly on a substrate using a set of nucleation layer growth parameters, wherein the set of nucleation layer growth parameters include a V/III ratio in a range of 15000 to 25000 and a temperature in a range of 600 degrees Celsius to 850 degrees Celsius; and growing an aluminum nitride layer on the nucleation layer using a set of aluminum nitride layer growth parameters, wherein the aluminum nitride layer growth parameters include a V/III ratio in a range of 1000 to 2500 and a temperature in a range of 1100 degrees Celsius to 1400 degrees Celsius, wherein the aluminum nitride layer has a tensile strain in a range of 0.1 percent to 1 percent after growth.

A second aspect of the invention provides a method of fabricating a light emitting device, the method comprising: growing an aluminum nitride nucleation layer directly on a substrate using a set of nucleation layer growth parameters, wherein the set of nucleation layer growth parameters include a V/III ratio in a range of 15000 to 25000 and a temperature in a range of 600 degrees Celsius to 850 degrees Celsius; growing an aluminum nitride layer on the nucleation layer using a set of aluminum nitride layer growth parameters, wherein the aluminum nitride layer growth parameters include a V/III ratio in a range of 1000 to 2500 and a temperature in a range of 1100 degrees Celsius to 1400 degrees Celsius, wherein the aluminum nitride layer has a tensile strain in a range of 0.1 percent to 1 percent after growth; growing a group III nitride cladding layer including a molar fraction of gallium of at least 0.1 on the aluminum nitride layer, wherein the cladding layer has a strain between 0.1 percent tensile and 0.5 percent compressive; and growing an active region on the cladding layer, wherein the active region comprises a plurality of quantum wells and barriers.

A third aspect of the invention provides a method of fabricating a group III nitride heterostructure, the method comprising: growing an aluminum nitride nucleation layer directly on a substrate using a set of nucleation layer growth parameters, wherein the set of nucleation layer growth parameters include a V/III ratio in a range of 15000 to 25000 and a temperature in a range of 600 degrees Celsius to 850 degrees Celsius, and wherein the substrate has a large lattice mismatch with the nucleation layer; growing an aluminum nitride layer on the nucleation layer using a set of aluminum nitride layer growth parameters, wherein the aluminum nitride layer growth parameters include a V/III ratio in a range of 1000 to 2500 and a temperature in a range of 1100 degrees Celsius to 1400 degrees Celsius, wherein the aluminum nitride layer has a tensile strain in a range of 0.1 percent to 1 percent after growth; growing a group III nitride transition layer directly on the aluminum nitride layer; and growing a group III nitride cladding layer including a molar fraction of gallium of at least 0.1 on the transition layer, wherein the cladding layer has a strain between 0.1 percent tensile and 0.5 percent compressive, and wherein the transition layer includes a molar fraction of gallium between the molar fraction of gallium in the cladding layer and zero.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
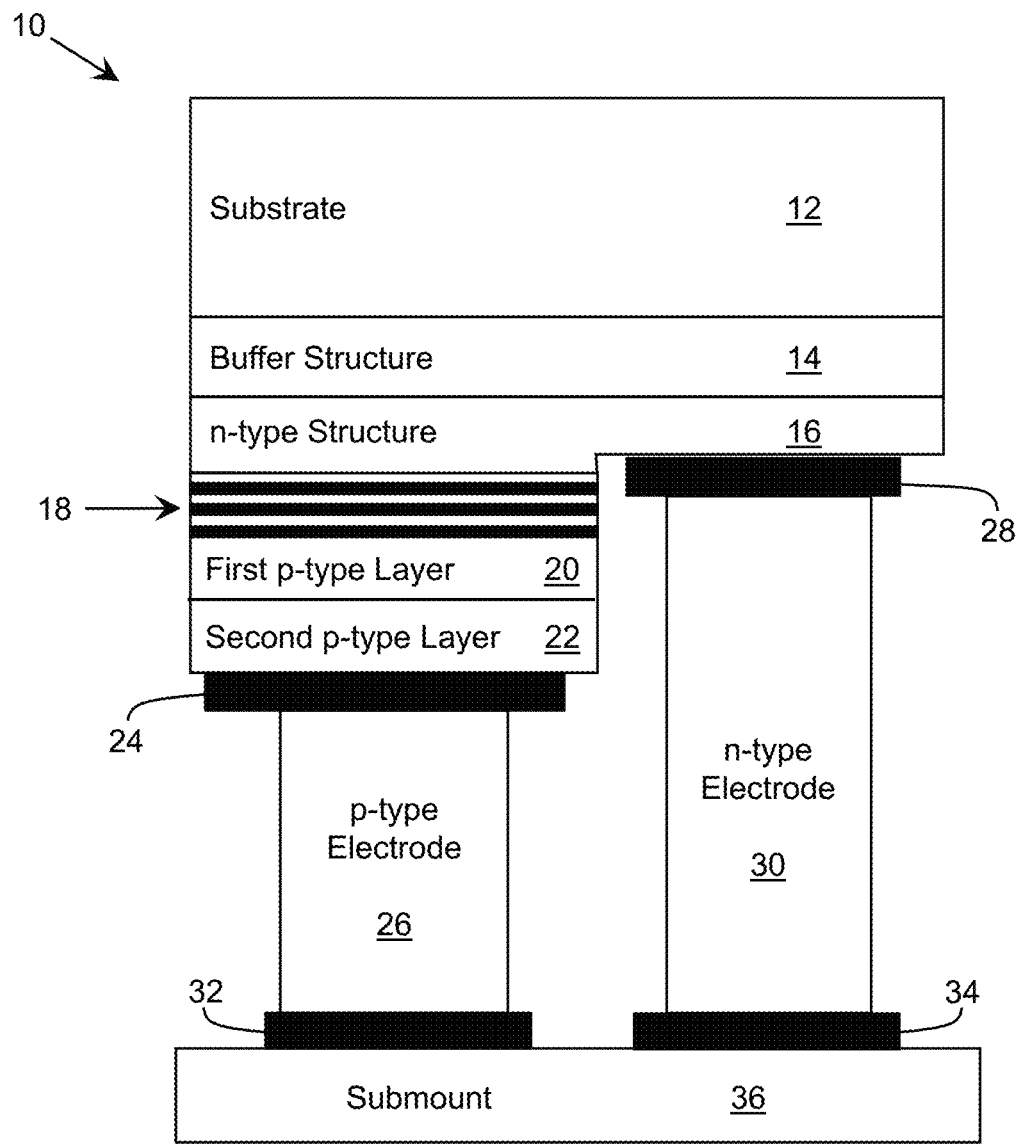
FIG. 1 shows a schematic structure of an illustrative optoelectronic device according to an embodiment.

As indicated above, aspects of the invention provide a solution for fabricating a group III nitride heterostructure and/or a corresponding device. The heterostructure can include a nucleation layer, which can be grown on a lattice mismatched substrate using a set of nucleation layer growth parameters. An aluminum nitride layer can be grown on the nucleation layer using a set of aluminum nitride layer growth parameters. The respective growth parameters can be configured to result in a target type and level of strain in the aluminum nitride layer that is conducive for growth of additional heterostructure layers resulting in strains and strain energies not exceeding threshold values which can cause relaxation and/or dislocation formation.

Embodiments of the invention can provide a solution for improving the reliability of a semiconductor heterostructure. In particular, the solution can control the stresses present within the heterostructure during growth by selecting a composition and a set of growth conditions for the various layers in the semiconductor. The composition can be controlled, for example, by adjusting a ratio of metalorganic precursors. Growth can be controlled by controlling the V/III ratio, temperature, pressure, rate of deposition, and/or the like. Such control can enable growth of higher quality heterostructure layers on a substrate, such as sapphire, having a large lattice mismatch with the heterostructure materials. The heterostructure can be utilized to fabricate an optoelectronic solid state device, such as a light emitting diode, having an improved reliability. In more particular embodiments, the optoelectronic device is an ultraviolet light emitting diode, a deep ultraviolet light emitting diode, a photodiode, and/or the like.

As used herein, unless otherwise noted, the term "set" means one or more (i.e., at least one) and the phrase "any solution" means any now known or later developed solution. As also used herein, a layer is a transparent layer when the layer allows at least ten percent (0.5% and 5% in provisional—ok to change?) of radiation having a target wavelength, which is radiated at a normal incidence to an interface of the layer, to pass there through. Furthermore, as used herein, a layer is a reflective layer when the layer reflects at least ten percent (5% in provisional—ok to change?) of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent). It is understood that, unless otherwise specified, each value is approximate and each range of values included herein is inclusive of the end values defining the range. As used herein, the term "optimize" and related terms refers to improving the corresponding attribute with respect to prior art approaches. Such improvement may or may not provide an optimal attribute for a given configuration, but other configurations may result in further improvements.

Each semiconductor layer has a corresponding lattice constant, which can be denoted as $a_f$, which can be measured (at least theoretically) when there are no external forces that act on the layer (i.e., there are no tensile or compressive forces acting on such layer). However, during epitaxial growth, a semiconductor layer can experience tensile or compressive strain, $\in$, and a corresponding tensile or compressive stress caused by action of nearby (neighboring) layers. The strain $\in$ within the semiconductor layer can be written as $\in=(a-a_f)/a_f$, where a is the lattice constant of the semiconductor layer during the application of forces on the layer. When $\in>0$, the strain is tensile, when $\in<0$, the strain is compressive. Strain can be measured directly by measuring the lattice constant in the semiconductor layer through x-ray measurements (e.g., x-ray powder diffraction), or can be inferred indirectly by evaluating a curvature of the layer grown on a substrate. For indirect measurements, the elastic properties of the substrate need to be known, as well as the elastic properties of the semiconductor layer.

The stresses within a semiconductor layer are proportional to the strains and are respectively called compressive or tensile stresses. The proportionality coefficient is typically an elastic biaxial module. It is understood that the above definition of strain does not need to be applied uniformly to the entire layer, and different sections can, in general, have different strain. Furthermore, the strain can be different within a layer at different depths of the layer. The average strain within the area (or along the thickness of the layer) can be calculated by integrating the strain over the area (or along the thickness of the layer) and dividing the integrand over the area (the thickness) of the layer. It is also understood that the application of Newton's third law holds in systems of semiconductor layers in as much as when a first layer induces tensile stress on a second layer, the second layer induces compressive stress of the same magnitude on the first layer. As used herein, unless otherwise stated, discussion of stress and/or strain correspond to the stress and/or strain present after growth of the corresponding layer.

Turning to the drawings, FIG. 1 shows a schematic structure of an illustrative optoelectronic device 10 according to an embodiment. In a more particular embodiment, the optoelectronic device 10 is configured to operate as an emitting device, such as a light emitting diode (LED), e.g., a conventional or super luminescent LED, a laser diode (LD), and/or the like. Regardless, during operation of the optoelectronic device 10, application of a bias comparable to the band gap results in the emission of electromagnetic radiation from an active region 18 of the optoelectronic device 10. The electromagnetic radiation emitted (or sensed) by the optoelectronic device 10 can have a peak wavelength within any range of wavelengths, including visible light, ultraviolet radiation, deep ultraviolet radiation, infrared light, and/or the like. In an embodiment, the device 10 is configured to emit (or sense) radiation having a dominant wavelength within the ultraviolet range of wavelengths. In a more specific embodiment, the dominant wavelength is within a range of wavelengths between approximately 210 and approximately 360 nanometers. In a still more specific embodiment, the dominant wavelength is within a range of wavelengths between approximately 300 and approximately 360 nanometers.

The optoelectronic device 10 includes a heterostructure 11 comprising a substrate 12, a buffer structure 14 adjacent to the substrate 12, an n-type structure 16 (e.g., a cladding layer, electron supply layer, contact layer, and/or the like) adjacent to the buffer structure 14, and an active region 18 having an n-type side adjacent to the n-type structure 16. Furthermore, the heterostructure 11 of the optoelectronic device 10 includes a first p-type layer 20 (e.g., an electron blocking layer, a cladding layer, hole supply layer, and/or the like) adjacent to a p-type side of the active region 18 and a second p-type layer 22 (e.g., a cladding layer, hole supply layer, contact layer, and/or the like) adjacent to the first p-type layer 20.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any combination of various molar fractions for the group III elements.

An illustrative embodiment of a group III nitride based optoelectronic device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, the n-type structure 16, the first p-type layer 20, and the second p-type layer 22 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, 20, and 22. When the optoelectronic device 10 is configured to be operated in a flip chip configuration, such as shown in FIG. 1, the substrate 12 and buffer structure 14 can be transparent to the target electromagnetic radiation. To this extent, an embodiment of the substrate 12 is formed of sapphire, and the buffer structure 14 can be composed of AlN, an AlGaN/AlN superlattice, and/or the like. However, it is understood that the substrate 12 can be formed of any suitable material including, for example, silicon carbide (SiC), silicon (Si), bulk GaN, bulk AlN, bulk or a film of AlGaN, bulk or a film of BN, AlON, LiGaO$_2$, LiAlO$_2$, aluminum oxinitride ($AlO_xN_y$), MgAl$_2$O$_4$, GaAs, Ge, or another suitable material. Furthermore, a surface of the substrate 12 can be substantially flat or patterned using any solution. Regardless, a substrate 12 can have a large lattice mismatch with the materials of the buffer structure 14. As used herein, a large lattice mismatch between the substrate 12 and the buffer structure 14 is a lattice mismatch between the corresponding materials that exceeds three percent.

The optoelectronic device 10 can further include a p-type contact 24, which can form an ohmic contact to the second p-type layer 22, and a p-type electrode 26 can be attached to the p-type contact 24. Similarly, the optoelectronic device 10 can include an n-type contact 28, which can form an ohmic contact to the n-type structure 16, and an n-type electrode 30 can be attached to the n-type contact 28. The p-type contact 24 and the n-type contact 28 can be formed of one or more metals, and form ohmic contacts to the corresponding layers 22, 16, respectively.

In an embodiment, the p-type contact 24 and the n-type contact 28 each comprise several conductive and reflective metal layers, while the n-type electrode 30 and the p-type electrode 26 each comprise highly conductive metal. In an embodiment, the second p-type layer 22 and/or the p-type electrode 26 can be transparent to the electromagnetic radiation generated by the active region 18. For example, the second p-type layer 22 and/or the p-type electrode 26 can comprise a short period superlattice lattice structure, such as an at least partially transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type structure 16 and/or the n-type electrode 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the electrodes 26, 30 in a flip chip configuration. In this case, the substrate 12 is located on the top of the optoelectronic device 10. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like.

Any of the various layers of the optoelectronic device 10 can comprise a substantially uniform composition or a graded composition. For example, a layer can comprise a graded composition at a heterointerface with another layer. In an embodiment, the first p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the optoelectronic device 10 described herein is only illustrative. To this extent, an optoelectronic device and/or heterostructure can include an alternative layer configuration, one or more additional layers, and/or the like. As a result, while the various layers are shown immediately adjacent to one another (e.g., contacting one another), it is understood that one or more intermediate layers can be present in an optoelectronic device and/or heterostructure. For example, an illustrative optoelectronic device and/or heterostructure can include an undoped layer between the active region 18 and one or both of the first p-type layer 22 and the n-type structure 16.

Furthermore, an optoelectronic device and/or heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the second p-type layer 22 (e.g., a p-type cladding layer) and the active region 18. The DBR structure and/or the first p-type layer 20 can comprise any composition based on a desired wavelength of the light generated by the device/heterostructure. In one embodiment, the DBR structure comprises a Mg, Mn, Be, or Mg+Si-doped p-type composition. The first p-type layer 20 can comprise p-type AlGaN, AlInGaN, and/or the like. It is understood that a device/heterostructure can include both the DBR structure and the first p-type layer 20 (which can be located between the DBR structure and the second p-type layer 22) or can include only one of the DBR structure or the first p-type layer 20. In an embodiment, the first p-type layer 20 can be included in the device/heterostructure in place of an electron blocking layer. In another embodiment, the first p-type layer 20 can be included between the second p-type layer 22 and an electron blocking layer.

When included in an optoelectronic device 10, the electron blocking layer (e.g., the first p-type layer 20) can have the largest compositional gradient. As used herein, the compositional gradient corresponds to a change in composition of a layer between two points measured along a direction of the layer growth, divided by a thickness between the two points. As a result, this area of the optoelectronic device 10 can have the largest amount of stress. Such stress can lead to the generation of dislocations reducing reliability of the device 10. To increase reliability of the optoelectronic device 10, the amount of stress in the vicinity of the electron blocking layer can be decreased. In an embodiment, to reduce such stress, fabrication of each semiconductor layer in the optoelectronic device 10 can be configured to result in an overall distribution of stresses throughout the entire heterostructure of the optoelectronic device 10.

To this extent, each layer of a heterostructure can be grown using a set of growth parameters configured to result in a target amount of stress (tensile or compressive) for the corresponding layer. For example, the set of growth parameters for each layer can be selected to yield a particular type of stress (tensile or compressive) and a particular magnitude for the stress. The type and magnitude of stress present within a layer can be adjusted using any combination of one or more of various growth parameters including: growth temperature, growth pressure, V/III ratio, growth time, and/or the like. As an example, when growth time for a buffer layer is extended, the tensile stress present in the buffer layer typically increases.

Figure 2A:
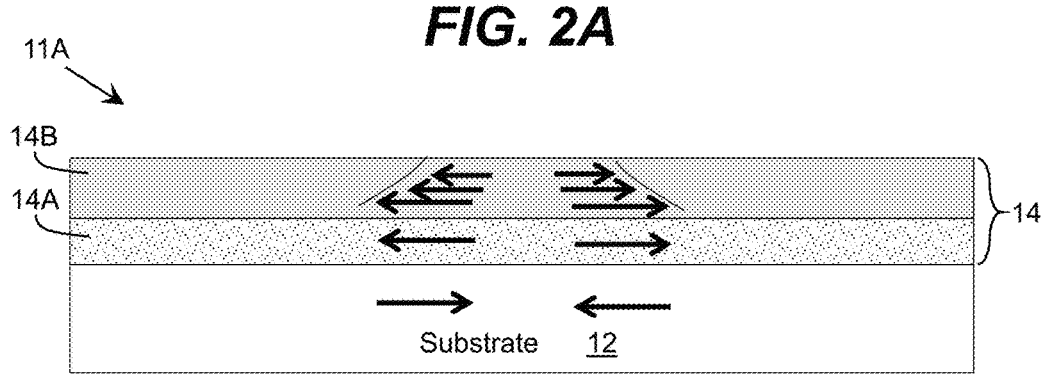
FIGS. 2A and 2B show portions of a device heterostructure during the fabrication thereof according to embodiments.
Figure 2B:
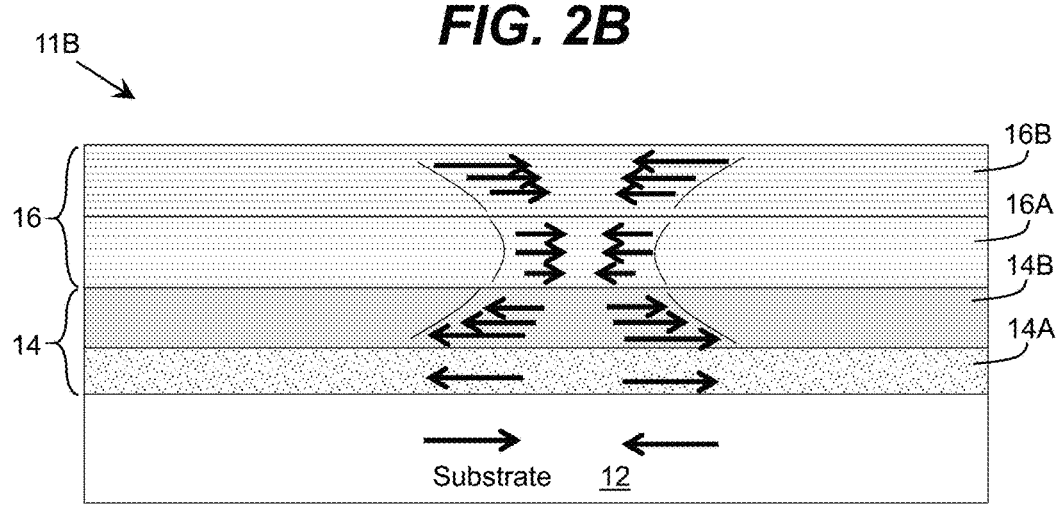

FIGS. 2A and 2B show portions of a device heterostructure 11A, 11B during the fabrication thereof according to embodiments. As illustrated in FIG. 2A, the buffer structure 14 can be epitaxially grown over the substrate 12. The buffer structure 14 can include an aluminum nitride nucleation layer 14A and an aluminum nitride layer 14B grown on the nucleation layer 14A. The nucleation layer 14A can be epitaxially grown using a first set of growth conditions, while the aluminum nitride layer 14B can be grown using a second set of growth conditions distinct from the first set of growth conditions. FIG. 2A schematically illustrates the tensile and compressive stresses present in each layer 12, 14 of the heterostructure 11 by the arrows. In particular, the substrate 12 is shown to have compressive stresses, while the buffer structure 14 has tensile stresses. The buffer structure 14 can have tensile stresses, and therefore the substrate 12 can have compressive stresses, due to, for example, coalescence of nucleation islands for the purpose of minimizing island boundary areas as described in the prior art.

The set of growth parameters for growth of the buffer structure 14 can be configured to create limited tensile stresses within the buffer structure 14. In an embodiment, growth of the buffer structure 14 uses a solution as shown and described in U.S. patent application Ser. No. 14/519, 230, filed on 21 Oct. 2014, which is hereby incorporated by reference. In this case, the buffer structure 14 can be a composite semiconductor layer including multiple layers. In particular, the nucleation layer 14A can comprise columnar structures and the aluminum nitride layer 14B immediately adjacent to the nucleation layer 14A can be at least partially continuous. However, it is understood that this is only illustrative, and growth of the buffer structure 14 on the substrate 12 can utilize any suitable solution.

The tensile stresses present in the nucleation layer 14A further result in tensile stresses in the aluminum nitride layer 14B. Due to relaxation of the aluminum nitride layer 14B, the tensile stresses can diminish as the thickness of the aluminum nitride layer 14B increases as indicated by the stress profile shown in conjunction with the arrows. In an embodiment, the tensile stresses of the nucleation layer 14A are chosen to enable growth of an aluminum nitride layer 14B having a thickness of at least 0.5 micrometers without generation of cracks within the aluminum nitride layer 14B, which are a natural way of relaxing a semiconductor layer under tension. In a more particular embodiment, the aluminum nitride layer 14B has a thickness higher than 0.5 micrometers without the formation of cracks, e.g., up to several micrometers, e.g., ten micrometers. However, when the heterostructure 11A is utilized to fabricate an optoelectronic device 10 (FIG. 1) configured to operate in (e.g., emit radiation having) a 300-360 nm wavelength range, the aluminum nitride layer 14B can be under tension and have a thickness less than approximately six micrometers.

A semiconductor layer can subsequently be grown on the buffer structure 14. In an embodiment, the semiconductor layer comprises an $Al_xGa_{1-x}N$ layer, with an aluminum molar fraction, x, in a range of 0.3-0.5, which is typical for an optoelectronic device 10 configured to operate in the 300-360 nm wavelength range. FIG. 2B shows an illustrative heterostructure 11B with an n-type structure 16 grown on the buffer structure 14. As illustrated, the n-type structure 16 can include a transition layer 16A, which is grown directly on the buffer structure 14 and a cladding layer 16B, which is grown directly on the transition layer 16A. Regardless, a type of stress can changes at the interface between the buffer structure 14 and the n-type structure 16.

Growth of an $Al_xGa_{1-x}N$, where $0.3 \leq x \leq 0.5$, n-type structure 16 on the aluminum nitride buffer structure 14 results in compressive stress within the n-type structure 16, as illustrated by the arrows and corresponding stress profiles in the layers 16A, 16B. The transition layer 16A can be configured to provide a smoother transition from the tensile stresses present in the aluminum nitride layer 14B and the compressive stresses present in the cladding layer 16B. To this extent, the transition layer 16A can have an aluminum molar fraction x between that of the cladding layer 16B and the underlying material (e.g., the aluminum nitride buffer structure 14). Such a configuration can result in smaller compressive stresses in the cladding layer 16B, as some of the compressive stresses are absorbed by the transition layer 16A. In an illustrative embodiment, the cladding layer 16B has a gallium molar fraction of at least 0.1 (e.g., an aluminum molar fraction of at most 0.9). In a more particular embodiment, the cladding layer 16B has an aluminum molar fraction x in a range of 0.3-0.5 and the transition layer 16A can have an aluminum molar fraction x in a range of 0.6-0.8. Alternatively, transitional layer 16A can be configured as a graded layer located between the aluminum nitride layer 14B and the cladding layer 16B. The grading can have various forms including, for example, a linear grading. The transition layer 16A and cladding layer 16B can be configured such that the cladding layer 16B has a strain between 0.1 percent tensile and 0.5 percent compressive.

Figure 3A:
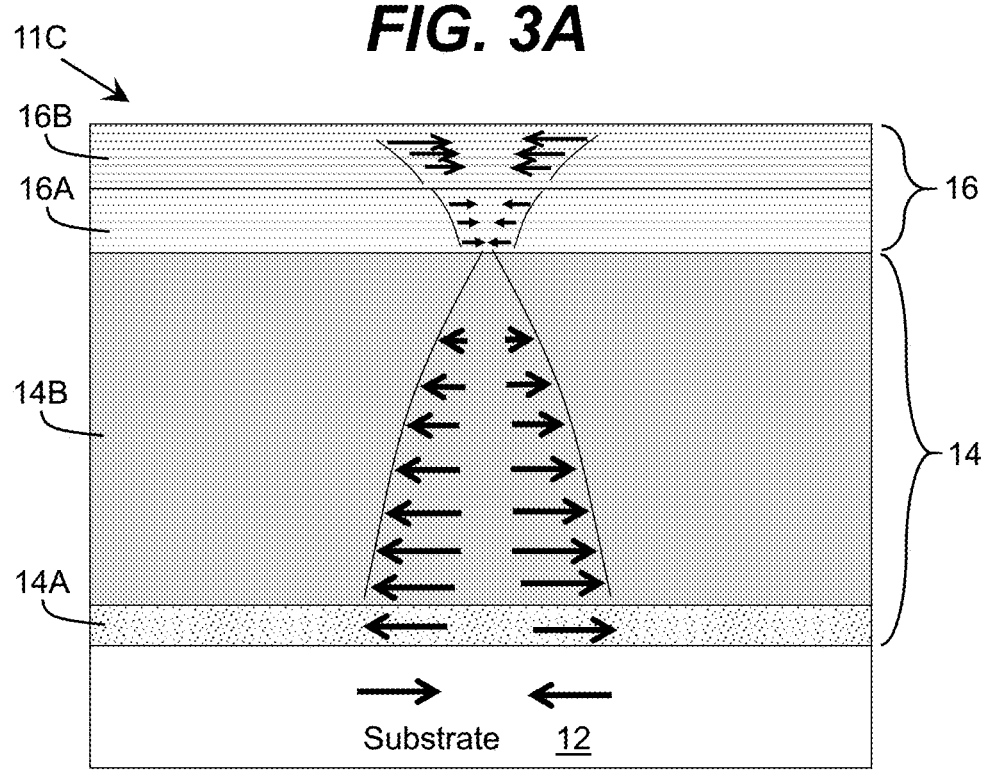
FIGS. 3A and 3B show alternative configurations of heterostructures for use in the fabrication of different optoelectronic devices according to embodiments.
Figure 3B:
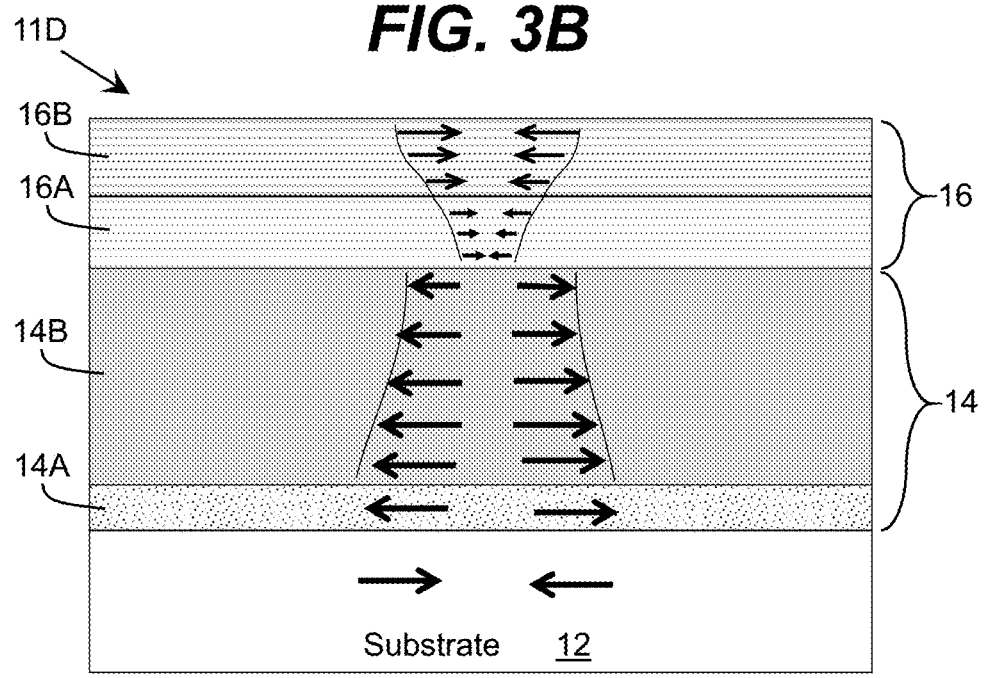

FIGS. 3A and 3B show alternative configurations of heterostructures 11C, 11D for use in the fabrication of different optoelectronic devices 10 (FIG. 1) according to embodiments. In each case, the set of growth conditions for the aluminum nitride layer 14B are adjusted to provide a distribution of stresses configured to improve a reliability of the heterostructure 11C, 11D and resulting optoelectronic device 10 operating at a target wavelength.

For example, the heterostructure 11C can be used to fabricate an optoelectronic device 10 configured to operate in the 240-300 nm wavelength range. In this case, the aluminum nitride layer 14B is grown to a greater thickness, e.g., 0.5 to ten micrometers, which results in a lower dislocation density and relaxation of the aluminum nitride layer 14B as illustrated by the diminishing tensile stress profile shown in the aluminum nitride layer 14B. For an optoelectronic device 10 configured to operate in the 300-360 nm wavelength range, the aluminum nitride layer 14B can have a residual tensile stress, which can result in a decrease of compressive stresses in layers subsequently grown thereon. To this extent, the heterostructure 11D is shown having an aluminum nitride layer 14B with a shorter thickness, e.g., 0.1 to five micrometers, as well as a higher tension than that present in the aluminum nitride layer 14B of the heterostructure 11C. The higher tension in the layer 14B can result in a reduction of the compressive strains present in the transition layer 16A and cladding layer 16B.

Figure 4:
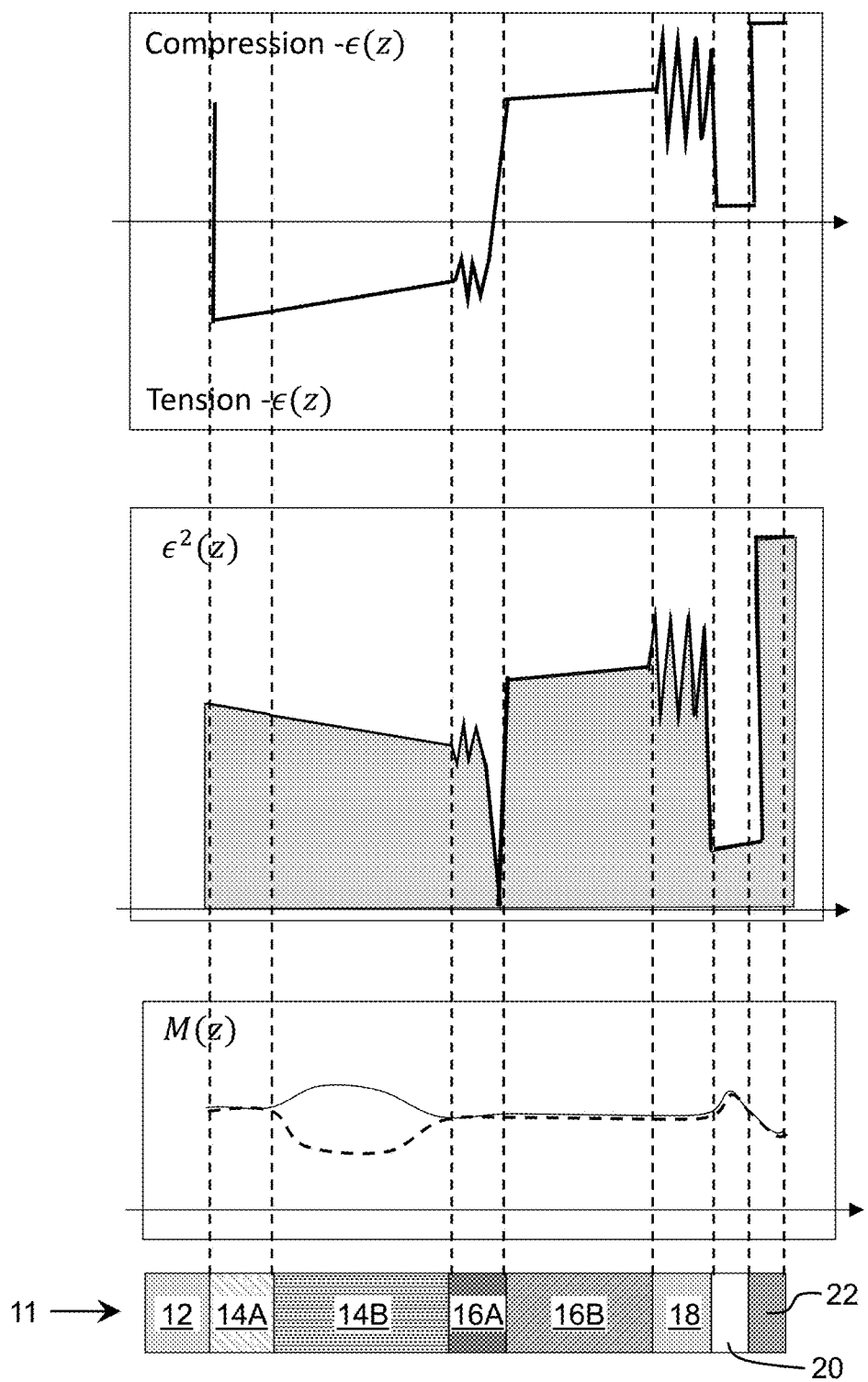
FIG. 4 shows quantitative distribution plots of elastic properties in an illustrative heterostructure during growth of the heterostructure prior to a cool down process according to an embodiment.

FIG. 4 shows quantitative distribution plots of elastic properties in an illustrative heterostructure 11 during growth of the heterostructure prior to a cool down process according to an embodiment. In this case, the heterostructure includes a substrate 12, a nucleation layer 14A, an aluminum nitride layer 14B, a transition layer 16A, a cladding layer 16B, an active region 18 comprising quantum wells and barriers, a first p-type layer 20 (e.g., an electron blocking layer), and a second p-type layer 22 having a high gallium nitride composition. In an embodiment, the transition layer 16A and/or the aluminum nitride layer 14B can comprise a superlattice layer or a combination of compressive and tensile layers grown by varying the V/III ratio during growth using a solution described in U.S. patent application Ser. No. 13/692,191, filed on 3 Dec. 2012, which is hereby incorporated by reference. In either case, the V/III ratio can be varied between 100 and 10000 during growth of the corresponding layer 14B, 16A. It is understood that the heterostructure 11 is only illustrative, and various modifications, additions of intermediate layers, and/or graded layers can be incorporated within the heterostructure 11, increasing the complexity of the stress-strain pattern within the layers.

The top plot shows a distribution plot of the negative of tensile strain, $-\in(z)$, where the tensile strain is given by the formula: $\in(z)=a(z)/a_0(z)-1$, where $a(z)$ is the lattice of the semiconductor layer in the stressed state, and $a_0(z)$ is the lattice of the semiconductor in the unstressed state. The negative tensile strain is plotted to match presentation of experimental bowing data for strain/stress. While quantitatively the distribution plot can be different for different heterostructures 11, including different slopes and shapes of the plot within each layer of the heterostructure 11, a general behavior for the strains during growth is with the substrate 12 under some compression, at least at the initial stages of growth of the semiconductor structure. The buffer structure 14, which can include a nucleation layer 14A and an aluminum nitride layer 14B, is grown under tensile stress. Some tensile strains can be present during growth of the transition layer 16A, which changes to compressive strains within the cladding layer 16B. Subsequent layers 18, 20, 22 are typically under compression during growth as shown in in the strain distribution plot, assuming the structure 11 is grown pseudomorphically on an aluminum nitride buffer structure 14.

For structures 11 having significant relaxation, either through the generation of cracks or through the generation of a large number of dislocations, the strain values within the semiconductor layers can be altered depending on a degree of the relaxation. For example, the strain energy stored within the semiconductor layers is given by the formula $A\int M(z)\in^2(z)dz=A\int\sigma(z)\in(z)dz$, where A is the planar area of the layer, $M(z)$ is the biaxial modulus, $\sigma(z)$ is stress as a function of the z-axis directed normal to the layer surface, and $\in(z)$ is the strain of the layer described herein. A reliability of the heterostructure 11 can be related to several factors, including: a maximum and minimum of the strain energy; a location at which the maximum and minimum of the strain energy is observed within the heterostructure 11; and an overall stored strain energy, or at least the energy stored within a subset of layers as these layers can release the strain energy through the generation of dislocations, cracking and other defect formations, leading to reliability and performance issues. For example, certain semiconductor layers within the heterostructure 11 are further removed from the active region 18 and therefore can have higher allowed levels of strain energy stored in these layers. In contrast, certain layers, such as an electron blocking layer 20, located in the proximity of the active region 18 should have lower values of the stored strain energy.

As illustrated by the center distribution plot shown in FIG. 4, the stored energy of a layer is related to the scaled (by $M(z)$) area under the curve of $\in(z)^2$. As a result, minimizing/reducing this area can minimize/reduce the strain energy, provided the biaxial modulus $M(z)$ is mostly constant within the semiconductor layers of the heterostructure 11. The biaxial modulus $M(z)$ varies slightly depending on the composition of a group III nitride semiconductor layer. For example, the biaxial modulus of AlN is about 500 gigapascal (GPa), whereas the biaxial modulus of GaN is about 480 GPa. In a first approximation, the biaxial modulus of a group III nitride compound can be assumed to be a linear combination of the biaxial modulus of AlN and GaN in the proportion of their molar fractions in the compound. However, experimental data can be obtained to obtain a more precise approximation, if necessary.

In an embodiment, the set of growth conditions of a group III nitride layer can be chosen to alter the overall biaxial modulus of the semiconductor layer. For example, the set of growth conditions can create a non-uniform composite layer, which can possibly contain pores and/or cavities. To this extent, the bottom distribution plot shown in FIG. 4 shows two embodiments of the biaxial modulus throughout the heterostructure 11. In one embodiment, shown in the solid line, the aluminum nitride layer 14B is grown using a set of growth conditions resulting in an aluminum nitride layer 14B having a smooth morphology (e.g., a layer without cavities and the like, a layer grown using two-dimensional growth techniques). In the alternative embodiment shown in the dashed line, the aluminum nitride layer 14B is grown using a set of growth conditions resulting in the aluminum nitride layer 14B containing cavities. Such a cavity containing aluminum nitride layer 14B can result in decreased stress within the aluminum nitride layer 14B and, as a result, possibly lower energy levels within the aluminum nitride layer 14B.

Figure 5:
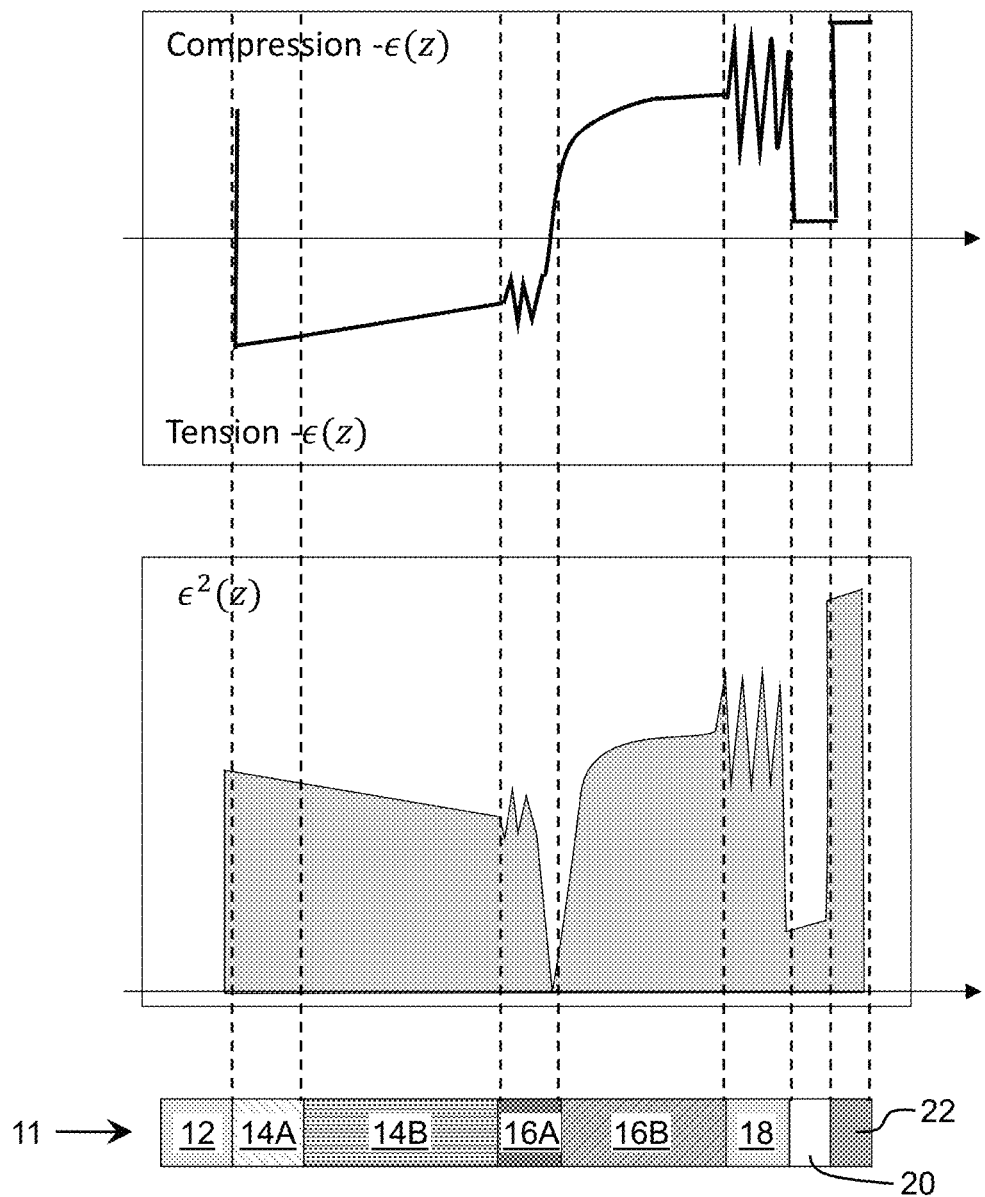
FIG. 5 shows quantitative distribution plots of elastic properties in another illustrative heterostructure during growth of the heterostructure prior to a cool down process according to another embodiment.

FIG. 5 shows quantitative distribution plots of elastic properties in another illustrative heterostructure 11 during growth of the heterostructure 11 prior to a cool down process according to another embodiment. In this case, the cladding layer 16B has a graded composition, which results in a gradual change in strain, and as a result strain energy, over a thickness of the cladding layer 16B. For example, the cladding layer 16B can have a composition that is initially comparable to the composition of the transition layer 16A and changes over a height of the cladding layer 16B to a composition that is comparable to the composition of the active region 18. Such a graded change can occur continuously, linearly, steps, and/or the like. A graded cladding layer 16B can result in a smoother distribution of stresses, allowing for growth of thicker layers and/or an overall reduction of a maximum value of stress within the cladding layer 16B.

Figure 6:
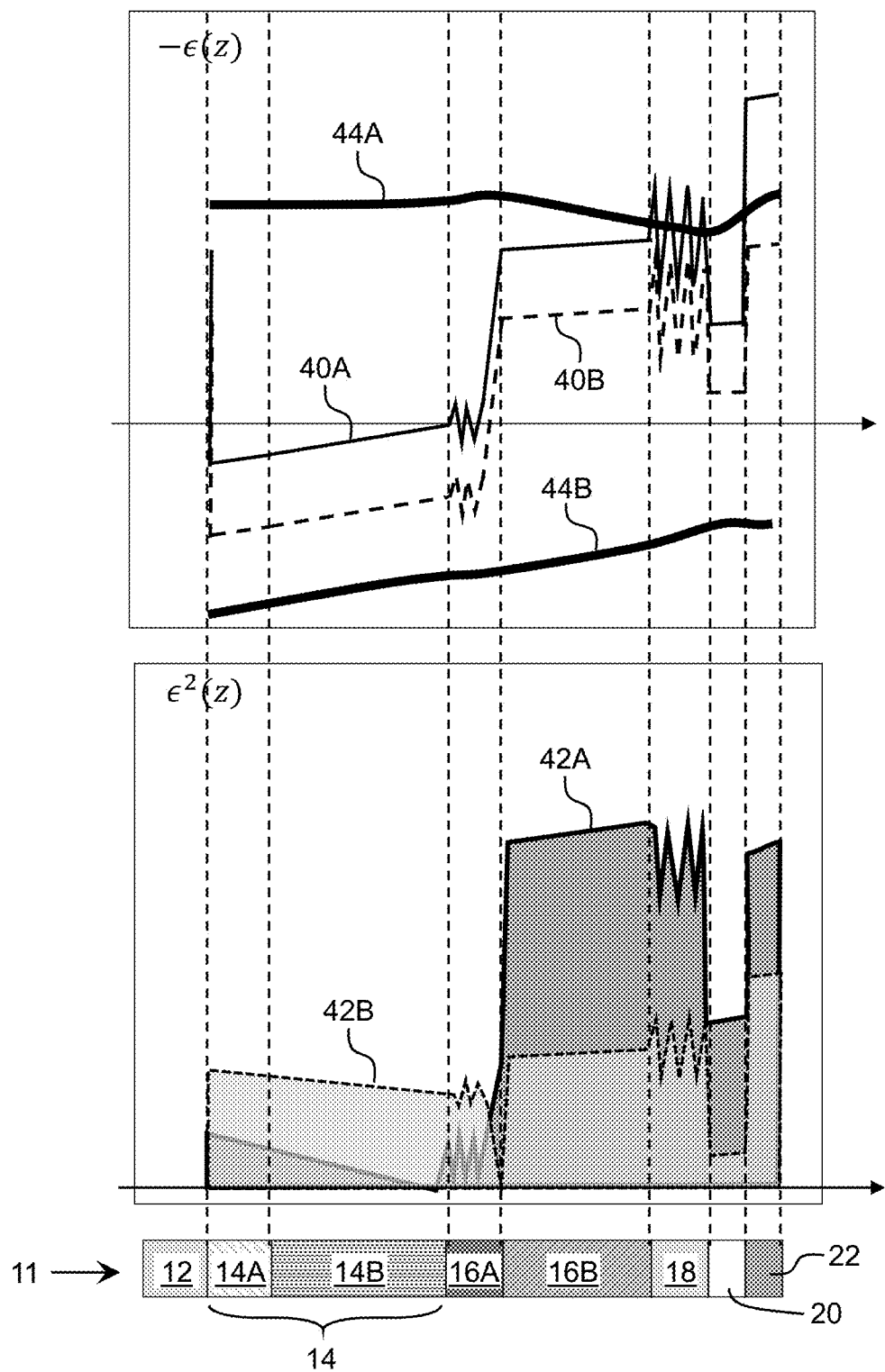
FIG. 6 shows quantitative distribution plots of elastic properties in still another illustrative heterostructure during growth of the heterostructure prior to a cool down process according to another embodiment.

FIG. 6 shows quantitative distribution plots of elastic properties in still another illustrative heterostructure 11 during growth of the heterostructure 11 prior to a cool down process according to another embodiment. In these plots, an effect of changing a set of growth conditions of the buffer structure 14 (e.g., the nucleation layer 14A and the aluminum nitride layer 14B), assuming pseudomorphic growth, are shown.

The strain plot 40A corresponds to use of a set of growth conditions for the buffer structure 14 which do not induce a significant tension in the buffer structure 14, and which remains smaller than a threshold value 44B, which can be determined from experimentation. In this case, significant compressive strain is present within the cladding layer 16B and subsequently grown layers 18, 20, 22. The high compressive strains in these layers result in a large stored energy as illustrated by the area under the bottom energy plot 42A. Conversely, when the buffer structure 14 is grown under substantial tension, as illustrated by the strain plot 40B, the compressive stresses present within the cladding layer 16B and subsequently grown layers 18, 20, 22 are reduced, leading to an overall decrease in the stored strain energy as illustrated by the area under the energy plot 42B.

The strain plot also includes plots 44A, 44B corresponding to a threshold value for the compressive strain and tensile strain, respectively, beyond which significant structural changes can be induced in an aluminum nitride layer. Such structural changes can lead to a high density of dislocations. As illustrated by the plots 44A, 44B, the threshold values are not necessarily constant within the heterostructure 11. For example, the threshold value around the active region 18 can be smaller than the threshold value of semiconductor layers further removed from the active region 18.

In effect, as long as the heterostructure 11 does not have strain (tensile or compressive) outside of threshold limits 44A, 44B, and maintains an overall stored strain energy below a certain threshold value, the resulting device is statistically more reliable than a device that does not satisfy these requirements. In particular, a probability of a device failing depends on a combination of these factors (the entire stored energy and the maximum of stored energy for a given layer). If one of these factors is large (e.g., the total strain energy stored in the device is large), then at least the second factor (e.g., the maximum stored energy for a given layer) can be lowered to yield a statistically more reliable device. In either case, high levels of strains can be avoided to improve the performance and reliability of the resulting device. However, as illustrated a tensile strain in the buffer structure 14 is beneficial to reducing both an overall strain energy within the heterostructure layers and a maximum strain energy for the semiconductor layers located in the proximity of the active region 18, which leads to an overall performance increase for the device.

In an embodiment, a set of growth conditions for the buffer structure 14 are selected to yield a shift of the strain plot 40A along the strain axis. For example, the shift can result in a strain plot comparable to the strain plot 40B, in which the strain (tensile or compressive) present in each layer of the heterostructure 11 is within a region defined by the threshold limit plots 44A, 44B. In a more particular embodiment, a minimum difference in values between a tensile strain and a corresponding threshold limit for the tensile strain in the layers of the heterostructure 11 is roughly equal to (+/−fifty percent) a minimum difference in values between a compressive strain and a corresponding threshold limit for the compressive strain in the layers of the heterostructure 11. For example, as shown in the strain plot 40A of FIG. 6, the transition layer 16A has a minimum difference between the tensile strain present therein and the threshold limit for the tensile strain indicated by the plot 44B, which is roughly equal to a minimum difference between the compressive strain present in the active region 18 and the threshold limit for the compressive strain indicated by the plot 44A.

In a more particular embodiment, the set of growth conditions for growing the buffer structure 14 using MOCVD include: growing the nucleation layer 14A using a V/III ratio in a range of 15000-25000 and a growth temperature in a range of 600-800 degrees Celsius followed by growing the aluminum nitride layer 14B using a V/III ratio in a range of 1000-2500 and a growth temperature in a range of 1100-1400 degrees Celsius. In this case, the aluminum nitride layer 14B is under tensile strain in a range of −0.1% to −1%. In an embodiment, the tensile strain can be inferred from x-ray measurements after the epitaxial growth, by comparing the lattice constant of the semiconductor layer with the unstressed lattice constant of the same semiconductor material. Such a set of growth conditions can yield a favorable distribution of strain within the semiconductor layers of the heterostructure 11, resulting in more statistically reliable devices.

It is understood that the above growth conditions are only illustrative. In general, growth conditions can be chosen to yield a minimum difference in values between a tensile strain and a corresponding threshold limit for the tensile strain in the layers of the heterostructure 11 which is roughly equal to a minimum difference in values between a compressive strain and a corresponding threshold limit for the compressive strain in the layers of the heterostructure 11. An illustrative measure is to involve stresses in a form of $M(z)\in^2(z)$. Such stresses incorporate dependence of the elastic biaxial module $M(z)$. Similarly, the growth conditions can be chosen to yield a minimum difference in values between a tensile stress and a corresponding threshold limit for the tensile stress in the layers of the heterostructure 11 that is roughly equal to a minimum difference in values between a compressive stress and a corresponding threshold limit for the compressive stress in the layers of the heterostructure 11. The growth conditions described herein can be accomplished through a number of epitaxial techniques, such as, for example, varying V/III ratio, growing superlattices of semiconductor layers, and/or growing thin (<1 nm)

interlayers of composition different than surrounding semiconductor material, where the difference in composition can be as much as 100%.

While FIG. 6 illustrates pseudomorphic growth of the group III nitride semiconductor layers in the heterostructure 11, frequently, partial or even significant relaxation can occur at boundaries between layers. Such relaxation can result in a more complicated behavior of strains present within the layers, and as a result, changes in the strain energy and dislocation density within the layers. For high wavelength optoelectronic devices operating between 300-360 nm, a gallium molar fraction within an AlGaN cladding layer 16B can be as high as 0.7-0.8, resulting in a significant lattice mismatch between the aluminum nitride layer 14B, the transition layer 16A, and the cladding layer 16B. As used herein, a lattice mismatch is defined as $a_1/a_2-1$, where $a_1$ is the lattice constant of the first lattice and $a_2$ is the lattice constant of the second lattice measured when the lattice is in the unstressed state. For example, when a first material has the same lattice constant as a second material, the lattice mismatch is zero. A high lattice mismatch (larger than 1.5%) can cause catastrophic relaxation, which results in significantly reduced levels of stress and a high density of dislocations.

Figure 7:
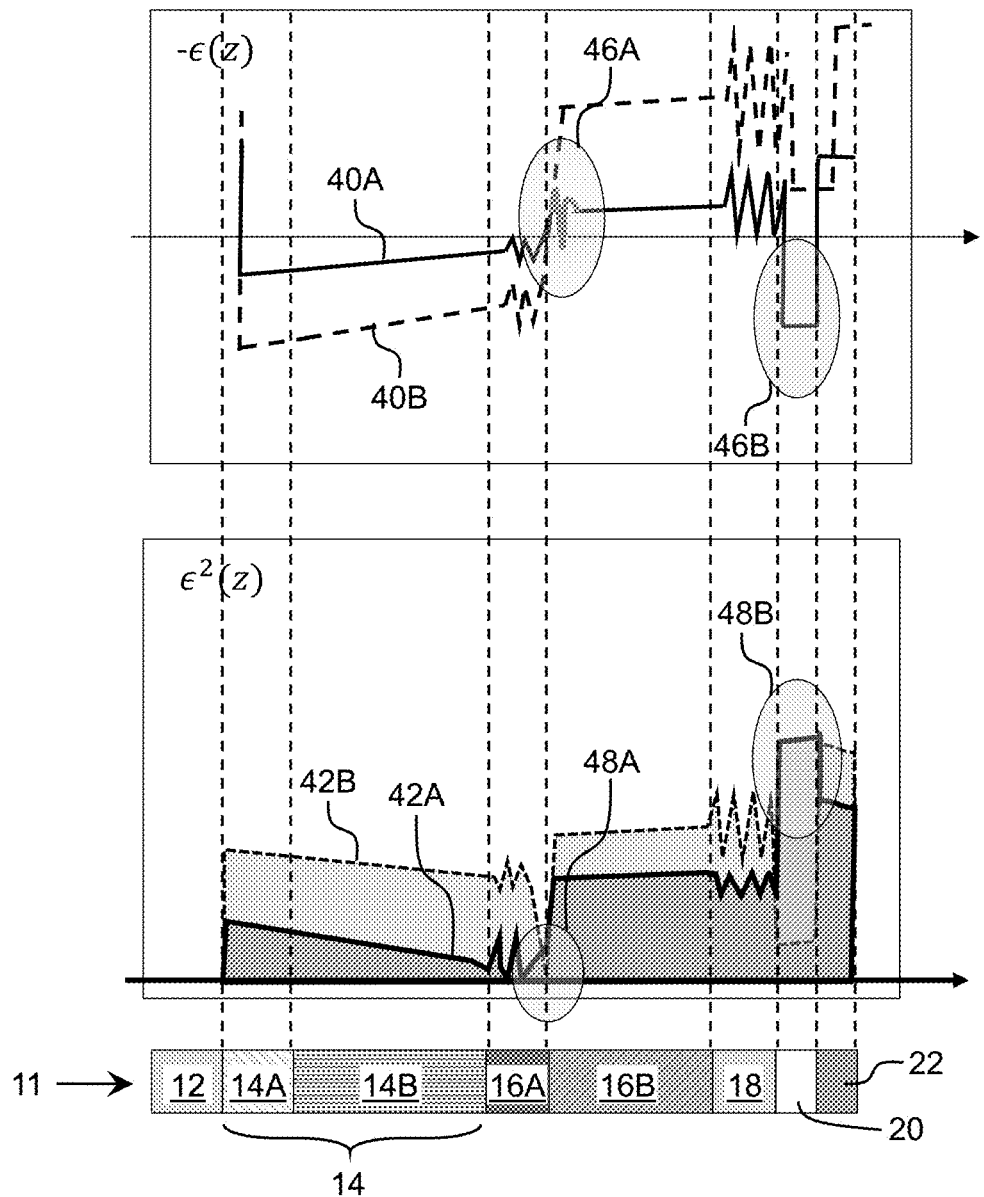
FIG. 7 shows quantitative distribution plots of elastic properties in an illustrative heterostructure with relaxation occurring in a set of layers according to an embodiment.

FIG. 7 shows quantitative distribution plots of elastic properties in an illustrative heterostructure 11 with relaxation occurring in a set of layers according to an embodiment. In this case, a strain plot 40A having a modest tension, e.g., a tensile strain of 0.5%, in the buffer structure 14 and the transition layer 16A results in partial relaxation of the epitaxially grown cladding layer 16B in the region 46A, which results in the generation of dislocations. With the cladding layer 16B being partially, or mostly relaxed, tensile stresses are induced in the barriers of the active region 18, and particularly high tensile stresses are induced in the subsequently grown electron blocking layer 20 as illustrated by the region 46B. The high tensile stresses in the electron blocking layer 20 are due to the electron blocking layer 20 containing a significantly higher molar fraction of aluminum, while being grown on an AlGaN active region 18 with the lattice of the AlGaN active region 18 being partially or mostly relaxed. As a result, the lattice mismatch between the AlGaN active region 18 and the subsequently grown electron blocking layer 20 is significant.

As shown in the stored strain energy profile, growth resulting in the strain plot 40A has a corresponding strain energy profile 42A, in which the strain energy is significantly reduced in the region 48A of the transition layer 16A and the cladding layer 16B and significantly increased in the region 48B corresponding to the electron blocking layer 20. The increased strain energy in the region 48B can result in possible relaxation and dislocation generation within the electron blocking layer 20. Furthermore, the decrease in strain energy shown in the region 48A is accompanied with a high density of dislocations generated at the interface between the layers 16A, 16B. These dislocations can propagate throughout the subsequent layers 16B, 18, 20, 22, thereby resulting in an overall reduced performance and decreased reliability for a device fabricated using the heterostructure 11.

In contrast, growth resulting in the strain plot 40B and strain energy profile 42B has increased tension for the buffer structure 14. Due to the presence of such tension, there is a smaller, or even nonexistent, relaxation within the cladding layer 16B. The strain energy profile 42B has a substantially smaller contribution in the electron blocking layer 20, which allows for mostly pseudomorphic growth of the electron blocking layer 20. Additionally, due to a substantial lack of relaxation at the interface between the layers 16A, 16B, the number of dislocations present in the subsequent layers 16B, 18, 20, 22 is reduced.

Figure 8:
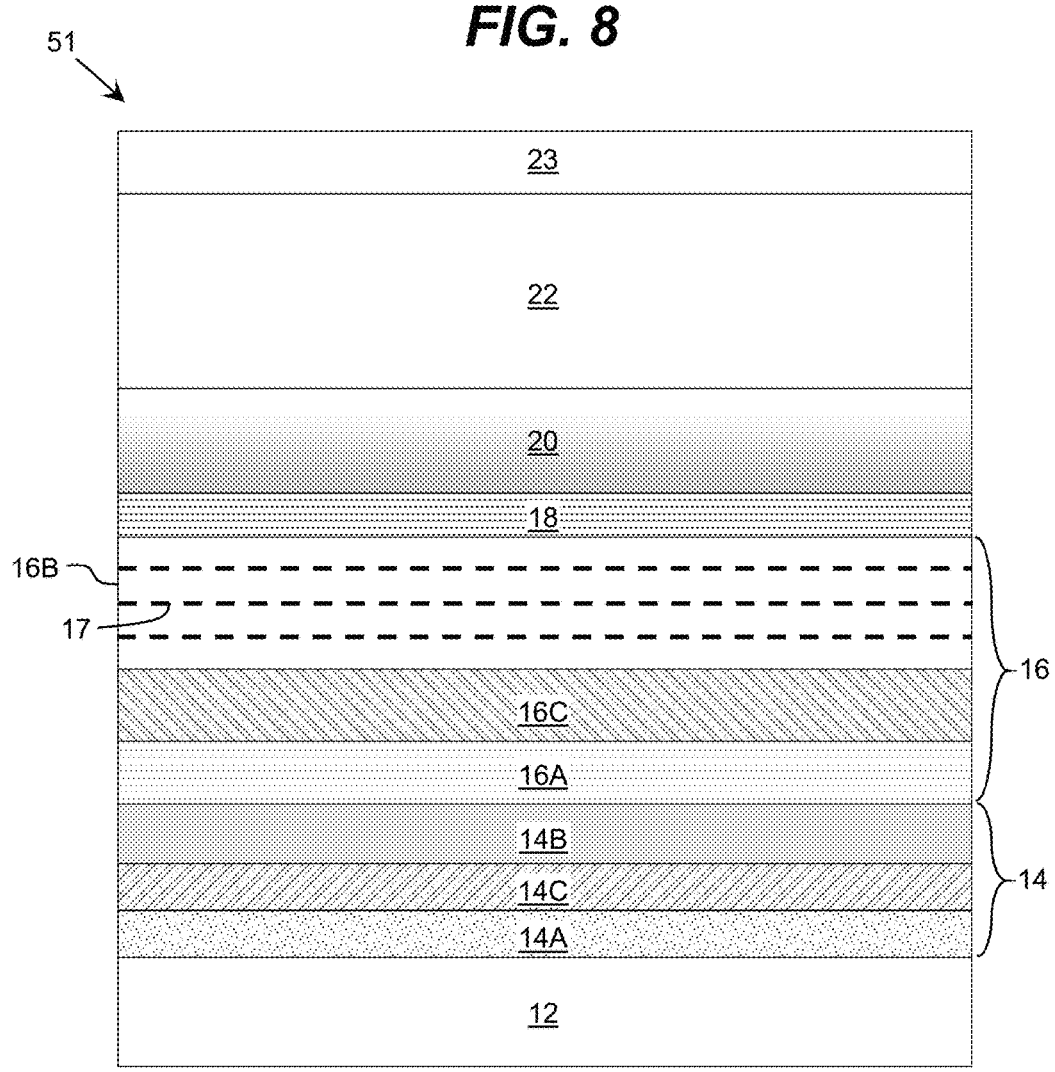
FIG. 8 shows an illustrative heterostructure according to another embodiment.

FIG. 8 shows an illustrative heterostructure 51 according to another embodiment. The heterostructure 51 can include a substrate 12, which can be, for example, sapphire or silicon carbide (SiC). However, the substrate 12 can comprise any suitable material, such as silicon (Si), diamond, a nitride substrate (e.g., AlN, GaN, BN, AlGaN, and/or the like), an oxide substrate (e.g., aluminum oxynitride, zinc oxide (ZnO), lithium gallate (LiGaO$_2$), lithium aluminate (LiAlO$_2$), lithium niobate (LiNbO$_3$), magnesium aluminate (MgAl$_2$O$_4$), scandium magnesium aluminum oxide (ScMgAlO$_4$), and/or the like), and/or other related materials.

As described herein, a buffer structure 14 can be epitaxially grown over the substrate 12 using a set of growth conditions configured to generate a target level of stresses within the buffer structure 14. For example, growth of the buffer structure 14 can include growth of a nucleation layer 14A using a set of growth parameters configured to yield a nucleation layer 14A having a high tension (e.g., by extending the growth time). Furthermore, the V/III ratio and/or temperature for growth of the nucleation layer 14A can be adjusted to yield a nucleation layer 14A with desired properties. Subsequently, an aluminum nitride layer 14B can be epitaxially grown over the nucleation layer 14A. In an embodiment, the aluminum nitride layer 14B comprises multiple sublayers, such as sublayers grown by alternating a V/III ratio to result in sublayers having alternating tensile and compressive stresses. However, the aluminum nitride layer 14B can contain tension due to growth of a tensile nucleation layer 14A. Throughout growth of the aluminum nitride layer 14B, the tension can be reduced as the aluminum nitride layer 14B is relaxed. Furthermore, dislocations can be annihilated, in part, during the relaxation process.

In an embodiment, an aluminum nitride cavity containing layer 14C can be grown on the nucleation layer 14A prior to growth of the aluminum nitride layer 14B. The cavity containing layer 14C can have a reduced biaxial modulus, which is designed to reduce stresses in the cavity containing layer 14C and increase uniformity and reduce dislocation density in the aluminum nitride layer 14B. An illustrative cavity containing layer 14C and the fabrication thereof, is shown and described in U.S. patent application Ser. No. 14/266,900, filed on 1 May 2014, which is hereby incorporated by reference. To this extent, the cavity containing layer 14C can have a thickness greater than two monolayers and include a plurality of cavities having a characteristic size (e.g., lateral diameter) of at least one nanometer and a characteristic separation (e.g., as determined by a shortest distance between the edges of two adjacent cavities) of at least five nanometers.

Figure 9:
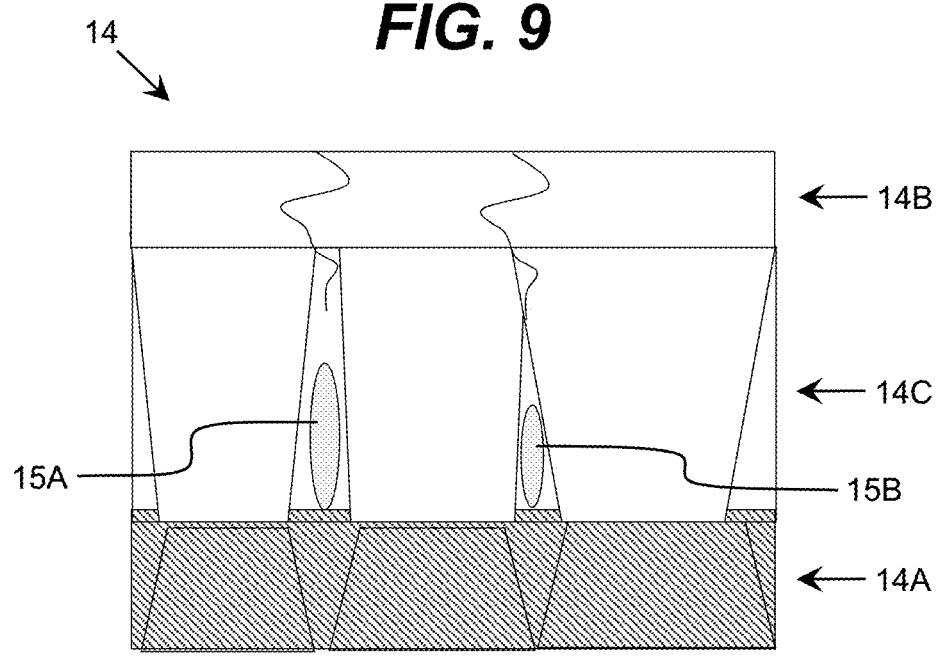
FIG. 9 shows further details of an illustrative buffer layer including a cavity containing layer according to an embodiment.

FIG. 9 shows further details of an illustrative buffer structure 14 including a cavity containing layer 14C according to an embodiment. As illustrated, the cavity containing layer 14C can include cavities 15A, 15B that have an initial lateral diameter at an interface between the cavity containing layer 14C and the nucleation layer 14A that gradually decreases towards the interface between the cavity containing layer 14C and the aluminum nitride layer 14B. In an embodiment, the decrease in the characteristic lateral diameter across the total thickness of the cavity containing layer 14C is at least ten percent. Inclusion of the cavity containing layer 14C can be combined with growth of the aluminum nitride layer 14B under tensile stress, where such tensile stress is controlled by the growth of the nucleation layer 14A. Attributes of the nucleation layer 14A determine subsequent tensile stresses. For example, for a nucleation layer 14A grown to contain a large number of small nucleation islands, the subsequent coalescence of such islands can lead to high tensile stresses. Alternatively, the nucleation layer 14A can be grown to contain a smaller number of large nucleation islands, leading to reduced tension. In an embodiment, the aluminum nitride layer 14B is grown to a thickness at least ten percent the thickness of the cavity containing layer 14C. While the buffer structure 14 is shown including a cavity containing layer 14C and an aluminum nitride layer 14B grown thereon, it is understood that embodiments of the buffer structure 14 can include the cavity containing layer 14C as a top layer of the buffer structure 14, in which case the n-type structure 16 is grown directly on the cavity containing layer 14C.

After growth of the buffer structure 14, fabrication of the heterostructure 51 can include growth of an n-type structure 16. In an embodiment, the n-type structure 16 includes a set of transition layers 16A grown directly on the buffer structure 14. The set of transition layers 16A can include, for example, a superlattice, a grading, and/or the like, configured to provide a transition between the buffer structure 14 and a cladding layer 16B. Additionally, the set of transition layers 16A can include alternating tensile and compressive layers resulting from, for example, variations of the V/III ratio during growth of the semiconductor layers. In an embodiment, a total thickness of the set of transition layers 16A is between 0.5-1 micrometers. In another embodiment, a combined thickness of the buffer structure 14 and the layers of the n-type structure 16 prior to the cladding layer 16B is at least two micrometers (more particularly at least four micrometers).

Regardless, the cladding layer 16B can be grown on the set of transition layers 16A. The cladding layer 16B can comprise an AlGaN layer having a thickness between 1-3 micrometers and more particularly between 1.5-2.5 micrometers. For a heterostructure 51 used to fabricate an optoelectronic device 10 (FIG. 1) configured to operate in the 300-360 nm range, the cladding layer 16B can have an aluminum molar fraction of 0.2-0.5. More particularly, for an optoelectronic device 10 configured to operate in the 300-320 nm range, the cladding layer 16B can have an aluminum molar fraction of 0.4-0.5. In an embodiment, the cladding layer 16B can further include a plurality of interlayers 17. Each interlayer 17 can have a thickness between 1-20 nm and have an aluminum content at least 50% higher than the aluminum content of the cladding layer 16B. In a more particular embodiment, the interlayers 17 can comprise aluminum nitride layers having a thickness of 1-10 monolayers. The interlayers 17 can be separated by a distance in a range of 20-80 nm. In an embodiment, the n-type structure 16 can further include an intermediate layer 16C grown on the set of transition layers 16A prior to growth of the cladding layer 16B, which can have an aluminum molar fraction higher than that of the cladding layer 16B, e.g., between 5-15% higher.

Formation of the n-type structure 16 can be followed by growth of an active region 18, which can include alternating quantum wells and barriers configured to emit radiation at the target wavelength. The cladding layer 16B can be n-type doped at least in the proximity of the active region 18. For example, the cladding layer 16B can be doped at least within one micrometer from the cladding layer 16B/active region 18 interface. In an embodiment, the active region 18 is not intentionally doped.

The heterostructure 51 can further include an electron blocking layer 20 formed on the active region 18. The electron blocking layer 20 can have a relatively high aluminum molar fraction, e.g., in a range 5-50% higher than the aluminum molar fraction of the barriers (e.g., the last barrier adjacent to the electron blocking layer 20) in the active region 18. The electron blocking layer 20 can be in a state of small compression provided that semiconductor layers are grown pseudomorphically on the buffer structure 14 having tension as described herein. A p-type layer 22 can be grown on the electron blocking layer 20 and a highly p-type doped AlGaN layer 23 can be grown on the p-type layer 22. In an embodiment, the p-type layer 22 can comprise a set of sublayers designed to transition between the electron blocking layer 20 and the highly p-type doped AlGaN layer 23. The highly p-type doped AlGaN layer 23 can have a high gallium content. The p-type layer 22 can be a graded layer located between the electron blocking layer 20 and the highly p-type doped AlGaN layer 22. Alternatively, the p-type layer 22 can comprise $Al_xGa_{1-x}N$ with x ranging from 0.5-0.1 and be under compression. In an embodiment, growth of the electron blocking layer 20 uses a temperature in a range of 950-1150 degrees Celsius. Furthermore, growth of the p-type layer 22 can use a temperature range at least 1% lower than that used for the electron blocking layer 20 (e.g., 855-1035 degrees Celsius).

Reliability of a device fabricated using the heterostructure 51 also can be adversely affected by diffusion of p-type dopant atoms (e.g., magnesium) into the active region 18 though the electron blocking layer 20. Such diffusion is high in an electron blocking layer 20 containing a large number of dislocations. As a result, reducing a dislocation density within the electron blocking layer 20 as described herein can further improve device reliability by reducing the diffusion of p-type dopant atoms into the active region 18. Additionally, reliability of the device can be increased by reducing presence of the p-type dopant atoms in a vicinity of the active region 18. For example, in an embodiment, the electron blocking layer 20 is not intentionally doped during growth. Alternatively, the p-type doping level used during growth of the electron blocking layer 20 can be significantly less than (e.g., at most 10% of) the p-type doping level used during growth of the p-type layer 22. For example, the p-type doping level used during growth of the electron blocking layer 20 can be less than $10^{18}$ dopants per cubic centimeter. Furthermore, the p-type doping of the p-type layer 22 can be increased in a direction away from the electron blocking layer 20.

Figure 10:
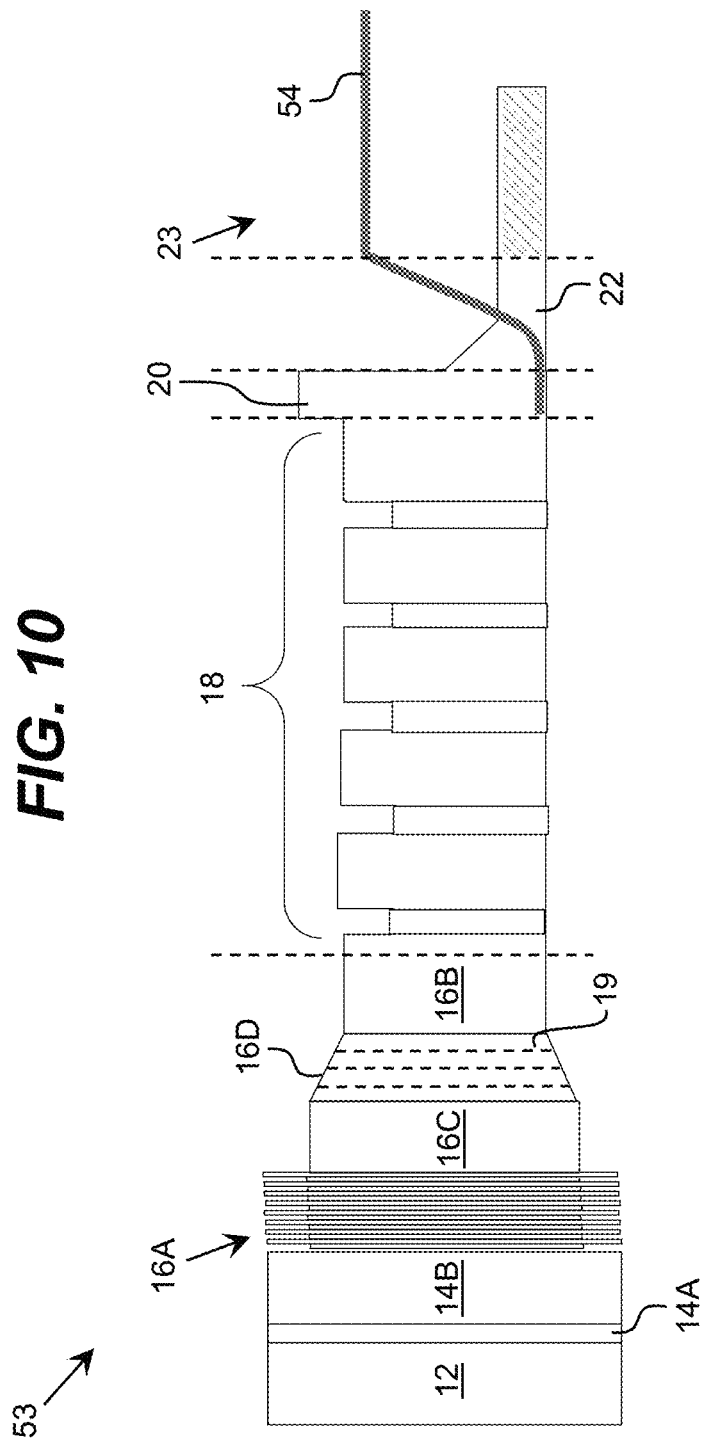
FIG. 10 shows compositional schematics of an illustrative heterostructure according to an embodiment.

FIG. 10 shows compositional schematics of an illustrative heterostructure 53 according to an embodiment. In this case, composition is illustrated as a possible molar fraction of aluminum in each of the layers. As illustrated, the heterostructure 53 can comprise a transition layer 16A comprising one or more superlattices of AlN/AlGaN layers configured to suppress dislocations. Each superlattice can comprise periodic sublayers, with each sublayer being between 5-40 nm thick. In an embodiment, the superlattice includes at least ten periods. In a more particular embodiment, the transition layer 16A comprises multiple sets of superlattice layers, each of which includes at least ten periods, and each subsequent superlattice layer having AlGaN sublayers with increasing gallium content. In a still more particular embodiment, the transition layer 16A comprises a first set of AlN/AlGaN superlattice layers with gallium molar fraction in a range of 0.1-0.3 and a second set of AlN/AlGaN superlattice layers with a gallium molar fraction higher than the gallium molar fraction in the first set in a range of 0.2-0.5. Furthermore, the transition layer 16A is followed by an AlGaN intermediate layer 16C having an aluminum molar fraction 5-15% higher (5-10% higher in a more particular embodiment) than the aluminum molar fraction in the cladding layer 16B.

Additionally, the intermediate layer 16C is followed by a graded layer 16D having a graded aluminum molar fraction that changes from that of the intermediate layer 16C to that of the cladding layer 16B. In an embodiment, the graded layer 16D has a linear grading. Furthermore, the graded layer 16D can have a thickness between 0.1-0.6 micrometers. In an embodiment, the graded layer 16D can further include a plurality of interlayers 19, which can be configured similar to the interlayers 17 shown in conjunction with the cladding layer 16B in FIG. 8. In this case, each interlayer 19 in the graded layer 16D can have a thickness between 1-10 nm and have an aluminum content at least 30% higher than the aluminum content of the cladding layer 16B. In a more particular embodiment, a composition of each interlayer 19 in the graded layer 16D is selected to have substantially the same strain due to lattice mismatch between the composition of the interlayer 19 and the composition of the graded layer 16D for each of the interlayers 19 in the graded layer 16D. In another embodiment, during growth of the graded layer 16D, the V/III ratio can be varied between 100 and 10000 to create a superlattice therein.

In the heterostructure 53, the aluminum molar fraction of the barriers in the active region 18 is approximately equal to the aluminum molar fraction of the cladding layer 16B. However, it is understood that these molar fractions can differ by up to 20%. As illustrated by the p-type doping profile 54, the electron blocking layer 20 can include no or a low level of p-type doping, and the p-type doping in the p-type layer 22 can be increased over a latter portion of growth of the p-type layer 22. The increase can peak at a p-type doping level for the highly p-type doped AlGaN layer 23, which can comprise at least $10^{19}$ dopants per cubic centimeter.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 11:
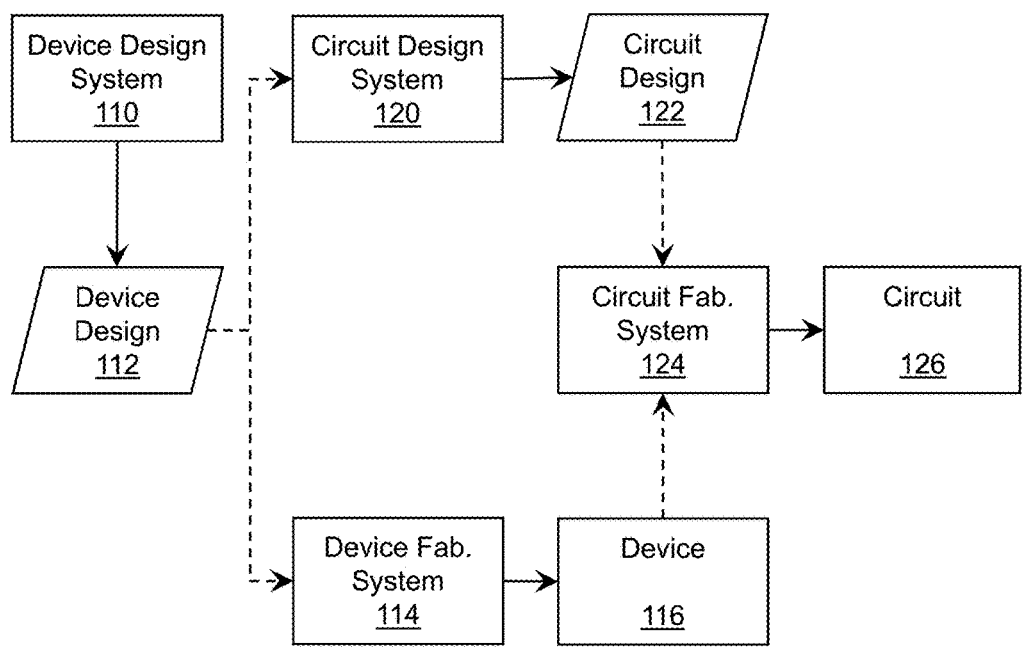
FIG. 11 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a group III nitride heterostructure, the method comprising:
growing an aluminum nitride nucleation layer directly on a substrate using a set of nucleation layer growth parameters, wherein the set of nucleation layer growth parameters include a V/III ratio in a range of 15000 to 25000 and a temperature in a range of 600 degrees Celsius to 850 degrees Celsius;
growing a cavity containing layer directly on the nucleation layer, wherein the cavity containing layer includes a plurality of cavities; and
growing an aluminum nitride layer on the cavity containing layer using a set of aluminum nitride layer growth parameters, wherein the aluminum nitride layer growth parameters include a V/III ratio in a range of 1000 to 2500 and a temperature in a range of 1100 degrees Celsius to 1400 degrees Celsius, wherein the aluminum nitride layer has a tensile strain in a range of 0.1 percent to 1 percent after growth.

2. The method of claim 1, wherein the substrate has a large lattice mismatch with the nucleation layer.

3. The method of claim 1, further comprising growing a group III nitride cladding layer including a molar fraction of gallium of at least 0.1 on the aluminum nitride layer, wherein the cladding layer has a strain between 0.1 percent tensile and 0.5 percent compressive.

4. The method of claim 3, further comprising growing a group III nitride transition layer directly on the aluminum nitride layer prior to growing the cladding layer, wherein the transition layer includes a molar fraction of gallium between the molar fraction of gallium in the cladding layer and zero.

5. The method of claim 4, further comprising growing a graded layer directly on the transition layer prior to growing the cladding layer, wherein the graded layer has a linear grading from a composition of the transition layer at an interface between the graded layer and the transition layer to a composition of the cladding layer at an interface between the graded layer and the cladding layer.

6. The method of claim 3, wherein the cladding layer includes a plurality of interlayers having a higher aluminum content than an aluminum content of the surrounding cladding layer.

7. The method of claim 1, the plurality of cavities having a lateral diameter decreasing in a direction from the nucleation layer towards the aluminum nitride layer.

8. The method of claim 1, further comprising growing a group III nitride transition layer directly on the aluminum nitride layer, wherein the transition layer includes an AlN/AlGaN superlattice having at least ten periods.

9. The method of claim 1, wherein growing the aluminum nitride layer includes varying the V/III ratio.

10. The method of claim 1, further comprising growing an active region on the aluminum nitride layer, wherein the active region comprises a plurality of quantum wells and barriers.

11. A method of fabricating a light emitting device, the method comprising:
growing an aluminum nitride nucleation layer directly on a substrate using a set of nucleation layer growth parameters, wherein the set of nucleation layer growth parameters include a V/III ratio in a range of 15000 to 25000 and a temperature in a range of 600 degrees Celsius to 850 degrees Celsius;
growing an aluminum nitride layer on the nucleation layer using a set of aluminum nitride layer growth parameters, wherein the aluminum nitride layer growth parameters include a V/III ratio in a range of 1000 to 2500 and a temperature in a range of 1100 degrees Celsius to 1400 degrees Celsius, wherein the aluminum nitride layer has a tensile strain in a range of 0.1 percent to 1 percent after growth;
growing a group III nitride cladding layer including a molar fraction of gallium of at least 0.1 on the aluminum nitride layer, wherein the cladding layer has a strain between 0.1 percent tensile and 0.5 percent compressive; and
growing an active region on the cladding layer, wherein the active region comprises a plurality of quantum wells and barriers.

12. The method of claim 11, further comprising growing a group III nitride transition layer directly on the aluminum nitride layer prior to growing the cladding layer, wherein the transition layer includes a molar fraction of gallium between the molar fraction of gallium in the cladding layer and zero.

13. The method of claim 12, further comprising growing a graded layer directly on the transition layer prior to growing the cladding layer, wherein the graded layer has a linear grading from a composition of the transition layer at an interface between the graded layer and the transition layer to a composition of the cladding layer at an interface between the graded layer and the cladding layer.

14. The method of claim 11, wherein the cladding layer includes a plurality of interlayers having a higher aluminum content than an aluminum content of the surrounding cladding layer.

15. The method of claim 11, further comprising growing a cavity containing layer directly on the nucleation layer prior to growing the aluminum nitride layer, wherein the cavity containing layer includes a plurality of cavities having a lateral diameter decreasing in a direction from the nucleation layer towards the aluminum nitride layer.

16. The method of claim 11, further comprising growing a group III nitride transition layer directly on the aluminum nitride layer, wherein the transition layer includes an AlN/AlGaN superlattice having at least ten periods.

17. The method of claim 11, further comprising growing an electron blocking layer on the active region, wherein the electron blocking layer has an aluminum molar fraction 5-50% higher than an aluminum molar fraction of an adjacent barrier of the active region.

18. The method of claim 17, further comprising growing a p-type layer on the electron blocking layer, wherein a p-type doping level of the electron blocking layer is at most 10% of a p-type doping level of the p-type layer.

19. A method of fabricating a group III nitride heterostructure, the method comprising:
growing an aluminum nitride nucleation layer directly on a substrate using a set of nucleation layer growth parameters, wherein the set of nucleation layer growth parameters include a V/III ratio in a range of 15000 to 25000 and a temperature in a range of 600 degrees Celsius to 850 degrees Celsius, and wherein the substrate has a large lattice mismatch with the nucleation layer;
growing an aluminum nitride layer on the nucleation layer using a set of aluminum nitride layer growth parameters, wherein the aluminum nitride layer growth parameters include a V/III ratio in a range of 1000 to 2500 and a temperature in a range of 1100 degrees Celsius to 1400 degrees Celsius, wherein the aluminum nitride layer has a tensile strain in a range of 0.1 percent to 1 percent after growth;

growing a group III nitride transition layer directly on the aluminum nitride layer; and growing a group III nitride cladding layer including a molar fraction of gallium of at least 0.1 on the transition layer, wherein the cladding layer has a strain between 0.1 percent tensile and 0.5 percent compressive, and wherein the transition layer includes a molar fraction of gallium between the molar fraction of gallium in the cladding layer and zero.

20. The method of claim 19, further comprising growing a graded layer directly on the transition layer prior to growing the cladding layer, wherein the graded layer has a linear grading from a composition of the transition layer at an interface between the graded layer and the transition layer to a composition of the cladding layer at an interface between the graded layer and the cladding layer.

* * * * *